US 8,896,110 B2

(12) United States Patent
Hu et al.

(10) Patent No.: US 8,896,110 B2
(45) Date of Patent: Nov. 25, 2014

(54) PASTE THERMAL INTERFACE MATERIALS

(71) Applicant: Intel Corporation, Santa Clara, CA (US)

(72) Inventors: Wei Hu, Chandler, AZ (US); Zhizhong Tang, Tempe, AZ (US); Syadwad Jain, Chandler, AZ (US); Rajen S. Sidhu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/801,882

(22) Filed: Mar. 13, 2013

(65) Prior Publication Data

US 2014/0264820 A1    Sep. 18, 2014

(51) Int. Cl.
*H01L 23/02* (2006.01)
*H01L 23/373* (2006.01)

(52) U.S. Cl.
CPC ................ *H01L 23/3736* (2013.01)
USPC .... 257/678; 257/706; 257/720; 257/E21.006; 257/E21.54; 257/E21.077; 257/E21.267; 257/E21.293; 257/E21.499; 257/E21.511; 438/106; 438/122

(58) Field of Classification Search
USPC ......... 257/678, 706, 720, 713, 760, 762, 649, 257/491, 499, E21.006, E21.054, E21.077, 257/E21.267, E21.293, E21.499, E21.511; 438/106, 122
See application file for complete search history.

(56) References Cited

U.S. PATENT DOCUMENTS

| 6,840,777 | B2 * | 1/2005 | Sathe et al. | 439/65 |
| 7,091,063 | B2 * | 8/2006 | Sur et al. | 438/118 |
| 7,159,313 | B2 * | 1/2007 | Sathe et al. | 29/846 |
| 7,254,034 | B2 * | 8/2007 | Bolle et al. | 361/719 |
| 7,675,186 | B2 * | 3/2010 | Chen et al. | 257/790 |
| 7,808,789 | B2 * | 10/2010 | McKeown et al. | 361/710 |
| 8,404,977 | B2 * | 3/2013 | Fjelstad | 174/251 |

OTHER PUBLICATIONS

Renavikar et al., "Materials Technology for Environmentally Green Micro-electronic Packaging", Intel Technology Journal, vol. 12, Issue 1, 2008.
Ludwigson et al., "Damping and Stiffness of Particulate SiC—InSn Composite", Journal of Composite Materials, vol. 36, No. 19/2002.

* cited by examiner

*Primary Examiner* — David Nhu
(74) *Attorney, Agent, or Firm* — Schwabe, Williamson & Wyatt, P.C.

(57) ABSTRACT

Embodiments of the present disclosure describe techniques and configurations for paste thermal interface materials (TIMs) and their use in integrated circuit (IC) packages. In some embodiments, an IC package includes an IC component, a heat spreader, and a paste TIM disposed between the die and the heat spreader. The paste TIM may include particles of a metal material distributed through a matrix material, and may have a bond line thickness, after curing, of between approximately 20 microns and approximately 100 microns. Other embodiments may be described and/or claimed.

27 Claims, 5 Drawing Sheets

PASTE THERMAL INTERFACE MATERIALS

FIELD

Embodiments of the present disclosure generally relate to the field of integrated circuits, and more particularly, to techniques and configurations for a thermal interface material.

BACKGROUND

To dissipate potentially damaging heat during operations, integrated circuit (IC) products may include thermally conductive structures such as a heat spreader and/or a heat sink in thermal contact with IC components (such as dies). These structures may be attached to the IC components using a thermal interface material (TIM), such as a polymer-based TIM (PTIM) or a solid, pre-formed solder TIM (STIM).

The performance of existing STIMs may be limited by, among other things, a relatively thick bond line thickness (BLT) (e.g., 200-400 microns) which adds bulk to the IC product, the undesirable voids that may be formed as solvent is driven out of a STIM during cure, the risk of deforming pre-formed STIM during pick-and-place operations, and the long heating times required for sufficient cure. Existing PTIMs may be able to achieve smaller BLTs than STIMs, but have poorer thermal performance (e.g., a bulk thermal conductivity of 2-5 watts/Kelvin-meter, versus approximately 80 watts/Kelvin-meter for some pre-formed STIMs).

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure describe techniques and configurations for paste TIMs and their use in IC packages. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

Figure 1:
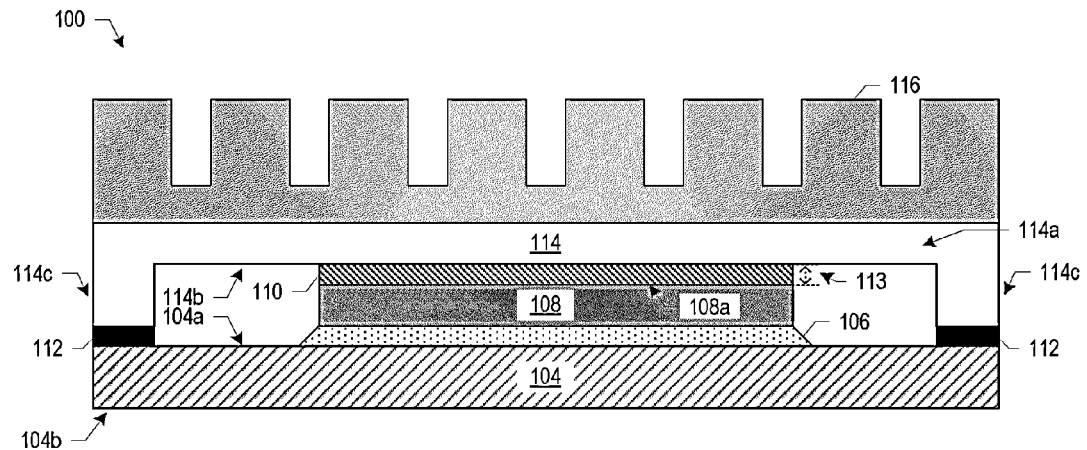
FIG. 1 is a cross-sectional side view of an example integrated circuit (IC) package including a paste thermal interface material (TIM), in accordance with some embodiments.

FIG. 1 schematically illustrates an example IC package 100, which may include an IC component 108 and a paste TIM 110. The IC component 108 may be coupled to a first surface 104a of a substrate 104 by an adhesive layer 106 (which may be, for example, a die-attach adhesive). In some embodiments, the substrate 104 may include a stack of thin layers or laminates that have a high modulus of elasticity and a low mismatch between the coefficient of thermal expansion (CTE) of the substrate materials and the CTE(s) one or more other portions of the IC package 100. Such embodiments of substrate 104 may provide advantageous package reliability. In some embodiments, substrate 104 may include organic materials such as glass-reinforced epoxy laminate or resin-based Bismaleimide-Triazine (BT). In some embodiments, substrate 104 may include ceramic materials such as aluminum oxide, silicon nitride or silicon carbide.

In some embodiments, the IC component 108 includes one or more dies. In some embodiments, the IC component 108 includes a plurality of IC units (such as dies) distributed along a carrier; in some such embodiments, the units may be separated after the IC package 100 is fabricated.

The IC package 100 may also include a heat spreader 114. The heat spreader 114 may be formed from one or more materials with high thermal conductivity, such as copper, and may serve to conduct heat away from elements of the IC package and spread this heat across a larger geometric area to increase the speed at which the heat radiates into the ambient environment. A first surface 114b of a first portion 114a of the heat spreader 114 may contact the paste TIM 110, which may be disposed between a first surface 108a of the IC component 108 and the heat spreader 114. In the configuration shown in FIG. 1, heat generated by the IC component 108 may be conducted through the paste TIM 110 to the heat spreader 114. In some embodiments, the IC package 100 may also include a heat sink 116 disposed on a second surface 114d of the heat spreader 114, which may further assist in conducting heat away from the IC package 110 and into the ambient environment.

Prior to curing, the paste TIM 110 may have a paste-like consistency. In some embodiments, the paste TIM 110 is distributable through a nozzle of a dispensing apparatus. A quantity of the fluid paste TIM 110 may be distributed on the first surface 108a of the IC component 108 and may be distributed across the first surface 108a by contact with the first surface 114b of the heat spreader 114 as the heat spreader 114 is positioned within the IC package 100. Embodiments of methods for fabricating the IC package 100 are discussed in additional detail below with reference to FIG. 2.

In some embodiments, the paste TIM 110 may include particles of a first material, particles of a metal material, and a matrix material. The first material included in the paste TIM 110 may be selected to have a thermal conductivity greater than approximately 80 watts/Kelvin-meter. The first material may be a non-metal. In some embodiments, the first material may include one or more of copper, diamond, graphite, silicon carbide, aluminum oxide or graphene.

In some embodiments, the metal material included in the paste TIM 110 may have a chemical composition different from that of the first material. As used herein, "metal material" includes pure metals, metal alloys (including solder materials, generally referred to as "solder" herein), and other metal compounds. In some embodiments, the metal material may include one or more of lead, a tin alloy (such as a lead-tin alloy or a tin-silver-copper alloy), indium, or an indium alloy (such as an indium-tin alloy). In some embodiments, the particles of the metal material included in the paste TIM 110 may have a nominal diameter between approximately 100 nanometers and approximately 150 microns. In some embodiments, metal materials having a melting temperature of less than 200 degrees Celsius may be preferred (and lower temperatures further preferred) to reduce the thermal mismatch between layers during cure and thereby reduce the potential for warping and damage. Table 1 lists a number of exemplary metal materials that may be used in the paste TIM 110 in accordance with various embodiments. It will be understood that the metal materials listed in Table 1 are simply illustrative, and that other metal materials are within the scope of the embodiments disclosed herein.

TABLE 1

Example metal materials for paste TIM.

| Metal Material | Melting Temperature |
| --- | --- |
| 48Sn—52In | 118 degrees Celsius (eutectic) |
| 42Sn—58Bi | 138 degrees Celsius (eutectic) |
| In | 157 degrees Celsius |
| 86.5Sn—5.5Zn—4.5In—3.5Bi | 174-186 degrees Celsius |
| 91Sn—9Zn | 199 degrees Celsius (eutectic) |
| SAC305 | 216-217 degrees Celsius |

The matrix material included in the paste TIM 110 may take any of a number of forms, or combinations of forms. In some embodiments, the matrix material may include a flux material. In some embodiments, the matrix material may include a polymer matrix material, which may take the form of a gel. In some embodiments, prior to curing the paste TIM 110 under heat and/or pressure, the matrix material includes a solvent. The solvent may make up less than 10% of the paste TIM 110 by weight, prior to curing. In some embodiments, the solvent used may have a boiling point higher than the boiling point of the cure temperature of the paste TIM 110, which may reduce the potential for the formation of voids during cure. Methods for curing a paste TIM are described in additional detail below.

In some embodiments, the paste TIM 110 may further include particles of a surface-active material. Including particles of a surface-active material in the paste TIM 110 may change the wetting property of the paste TIM 110 and thereby enable satisfactory distribution of the paste TIM 110 when the paste TIM 110 is compressed between the IC component 108 and the heat spreader 114. In some embodiments, the surface-active material may include gold, silver, and/or germanium.

In some embodiments, the particular identities and quantities of the components of paste TIM 110 are selected such that the paste TIM 110 has a desired bulk property. For example, in some embodiments, components of the paste TIM 110 may be selected such that the paste TIM 110 has a melting temperature between approximately 100 degrees Celsius and approximately 300 degrees Celsius. In some embodiments, components of the paste TIM 110 may be selected such that the paste TIM 110 has a melting temperature between approximately 100 degrees Celsius and approximately 200 degrees Celsius. In some embodiments, components of the paste TIM 110 may be selected such that the BLT of the paste TIM 110 (i.e., the thickness as measured in the dimension indicated by the arrow 113), after curing, is between approximately 20 microns and approximately 100 microns. In some embodiments, components of the paste TIM 110 may be selected such that the thermal conductivity of the paste TIM is greater than 80 watts/Kelvin-meter.

A sealant 112 may also be disposed on the first surface 104a of the substrate 104. A second portion 114c of the heat spreader 114 may contact the sealant 112 and may couple the heat spreader 114 to the substrate 104. The sealant 112 may comprise, for example, a silicon-based polymer. In some embodiments, the sealant 112 may be spaced away from the IC component 108 on the first surface 104a.

Figure 2A:
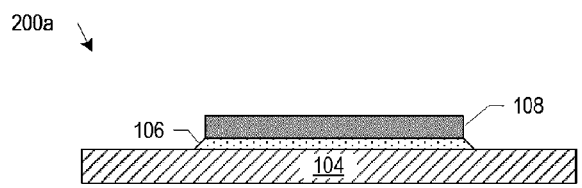
FIGS. 2A-2F schematically illustrate the IC package of FIG. 1 subsequent to various fabrication operations, in accordance with some embodiments.

FIGS. 2A-2F schematically illustrate the IC package 100 of FIG. 1 subsequent to various fabrication operations, in accordance with some embodiments. Referring to FIG. 2A, an IC package 200a is depicted subsequent to providing the substrate 104, and the IC component 108 coupled to the substrate 104 via the adhesive layer 106. In some embodiments, the IC component 108 may be a die.

Figure 2B:
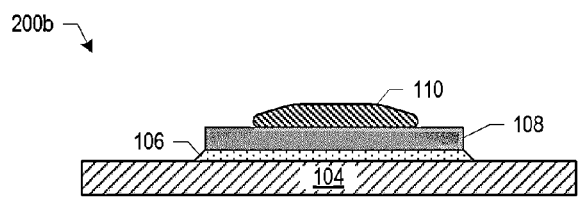

Referring to FIG. 2B, an IC package 200b is depicted subsequent to dispensing a sealant 112 on the substrate 104. The sealant 112 may be, for example, a silicon-based sealant.

Figure 2C:
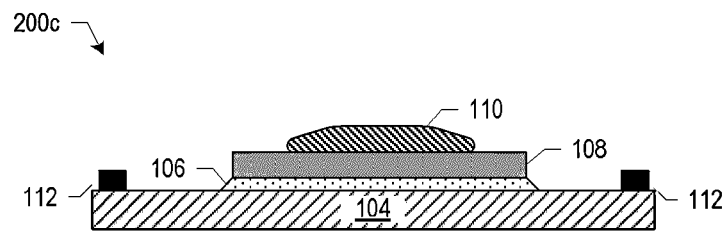

Referring to FIG. 2C, an IC package 200c is depicted subsequent to dispensing a quantity of the paste TIM 110 on the IC component 108. As discussed above, in some embodiments, the paste TIM 110 dispensed onto the IC component 108 may include a solvent; in preferred embodiments, the quantity of solvent in the paste TIM 110 may be less than 10% by weight, prior to curing. The consistency of the paste TIM 110 at the time it is dispensed onto the IC component 108 may be a paste-like fluid, and as such, the paste TIM 110 may dispensed onto the IC component 108 from a nozzle of a dispensing apparatus (e.g., a pressurized dispenser). In various embodiments, the dispensing of the sealant 112 (e.g., as shown in FIG. 2B) may occur before, after, or substantially simultaneously with the dispensing of the paste TIM 110. In some embodiments, the tooling used to dispense the paste TIM 110 on the IC component 108 may be the same or similar tooling used in existing manufacturing facilities to dispense PTIMs.

Figure 2D:
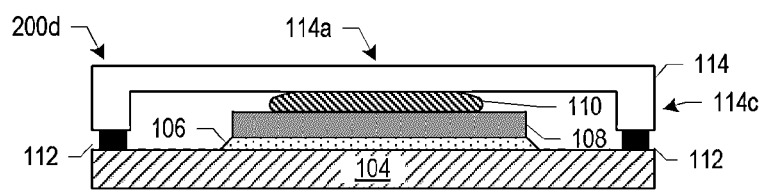

Referring to FIG. 2D, an IC package 200d is depicted subsequent to placing a heat spreader 114 on the paste TIM 110. The heat spreader 114 may be positioned such that the first portion 114a of the heat spreader 114 contacts the paste TIM 110 and the second portion 114c of the heat spreader 114 contacts the sealant 112. When the heat spreader 114 is positioned in contact with the paste TIM 110, the paste TIM 110 may be compressed between the heat spreader 114 and the IC component 108, which may cause the paste TIM 110 to spread.

Figure 2E:
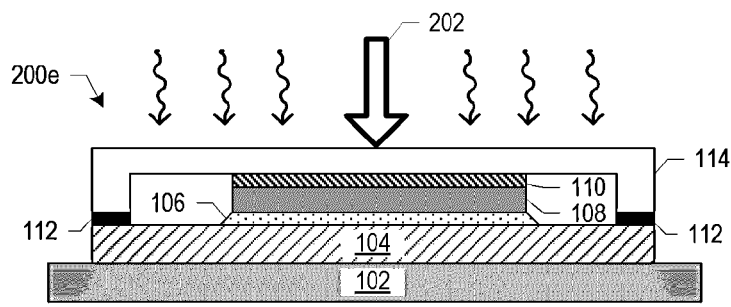

Referring to FIG. 2E, an IC package 200e is depicted during a curing operation. In some embodiments, curing the paste TIM 110 may include further compressing the paste TIM 110 between the heat spreader 114 and the IC component 108 by applying a force to the heat spreader 114 in the direction of the arrow 202 by, for example, a thermocompression bonding head or other device. The IC package 200e may be positioned on a pedestal 102 that may serve as a backing plate to support the IC package 200e during thermocompression bonding or other curing operation. In some embodiments, curing the paste TIM 110 may include heating the paste TIM 110 for less than five minutes. In some embodiments, curing the paste TIM 110 may include heating the paste TIM 110 at a temperature between 100 degrees Celsius and 200 degrees Celsius. The temperature at which the paste TIM 110 is cured may be based on the melting temperature of the paste TIM 110, which in turn may be based on the melting temperature of the components of the paste TIM 110 (e.g., the metal material). In some embodiments, a thermocompression bonding operation may be performed to both compress the paste TIM 110 and cure the paste TIM 110. In some embodiments, the paste TIM 110 may be compressed between the heat spreader 114 and the IC component 108 by a clip or other mechanical device. In some embodiments, the heat spreader 114 may be coupled to the IC package 200e during a direct lid attach operation.

Figure 2F:
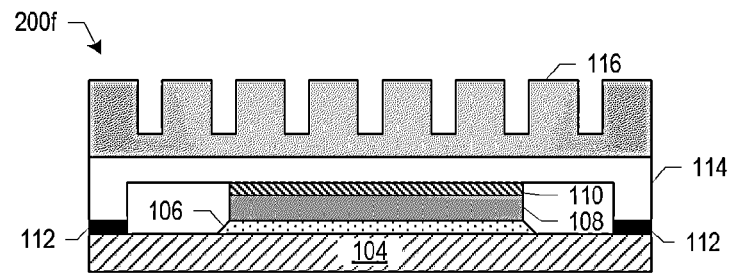

Referring to FIG. 2F, an IC package 200e is depicted subsequent to curing and to placing a heat sink 116 on the heat spreader 114. In some embodiments, after curing, the BLT of the paste TIM 110 is between 20 microns and 100 microns.

Figure 3:
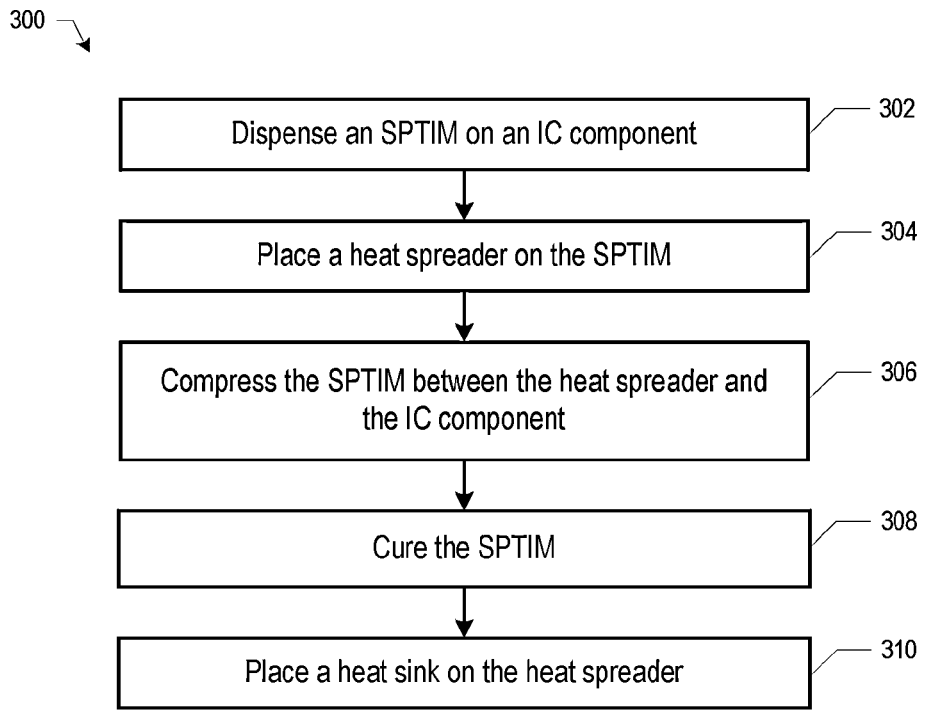
FIG. 3 is a flow diagram of a method of fabricating an IC package including a paste TIM, in accordance with some embodiments.

FIG. 3 is a flow diagram 300 of a method of fabricating an IC package including a paste TIM, in accordance with some embodiments. The method of flow diagram 300 may comport with actions described in connection with FIGS. 1 and 2A-2F, in some embodiments. Various operations are described as multiple discrete operations in turn for illustrative purposes; the order of description should not be construed as to imply that these operations are necessarily order dependent.

At 302, a paste TIM may be dispensed on a first surface of an IC component. The IC component may be a die. In some embodiments, 302 includes dispensing the paste TIM from a nozzle of a dispensing apparatus. In some embodiments, the paste TIM includes a solvent prior to curing, the solvent providing less than 10% of the paste TIM, by weight, prior to curing.

At 304, a heat spreader may be placed on the paste TIM. In some embodiments, 304 includes dispensing a sealant on the first surface of the substrate, the sealant spaced away from the IC component, and positioning the heat spreader such that a first portion of the heat spreader contacts the paste TIM and a second portion of the heat spreader contacts the sealant.

At 306, the paste TIM may be compressed between the heat spreader and the IC component. At 308, the paste TIM may be cured. In some embodiments, 306 and 308 are performed as part of a thermocompression bonding operation. As discussed above, in some embodiments, 308 may include heating the paste TIM for less than five minutes and/or at a temperature between 100 degrees Celsius and 200 degrees Celsius. In some embodiments, after curing, the bond line thickness of the paste TIM may be between 20 microns and 100 microns.

At 310, a heat sink may be placed on the heat spreader. In some embodiments, a heat sink is not placed on the heat spreader.

Figure 4:
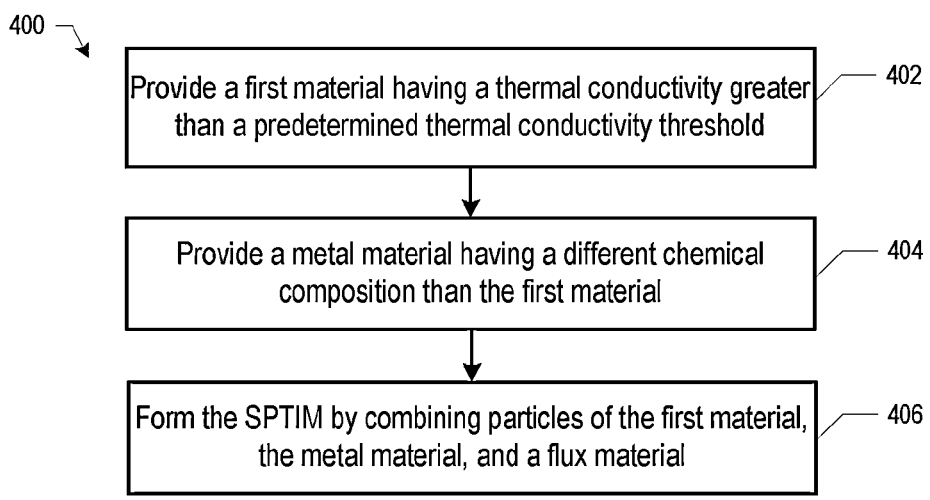
FIG. 4 is a flow diagram of a method of manufacturing a paste TIM, in accordance with some embodiments.

FIG. 4 is a flow diagram 400 of a method of manufacturing a paste TIM (e.g., the paste TIM 110), in accordance with some embodiments. The method of flow diagram 400 may comport with actions described in connection with FIGS. 1, 2A-2F, and 3, in some embodiments.

At 402, a first material may be provided. The first material may have a thermal conductivity greater than a predetermined conductivity threshold. In some embodiments, the predetermined conductivity threshold may be approximately 80 watts/Kelvin-meter. At 404, a metal material may be provided, the metal material having a different chemical composition than the first material. At 406, the paste TIM may be formed by combining particles of the first material, the metal material, and a flux material. In some embodiments, the paste TIM formed at 406 may have a melting temperature between approximately 100 degrees Celsius and approximately 300 degrees Celsius.

Figure 5A:
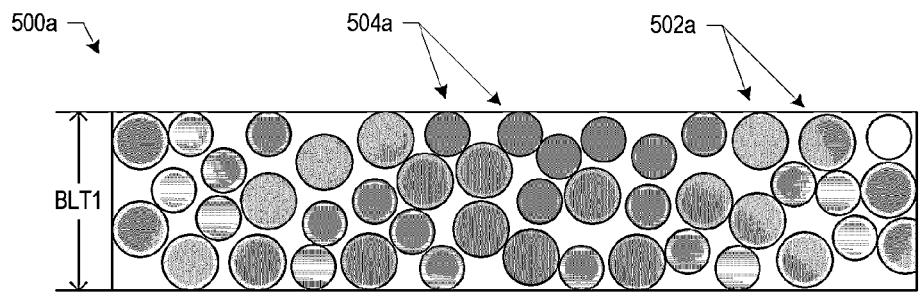
FIGS. 5A-5D are simplified cross-sectional side views of paste TIMs including variously-sized particles of materials, in accordance with some embodiments.

The sizes of particles included in a paste TIM according to the present disclosure may be selected to achieve various performance objectives. FIGS. 5A-5D are simplified cross-sectional side views of paste TIMs including variously-sized particles of materials, in accordance with some embodiments. In particular, FIG. 5A depicts a paste TIM 500a including particles 502a of a first material (e.g., the first material discussed above with reference to FIGS. 1, 2A-2F, 3 and 4) and particles 504a of a metal material (e.g., the metal material discussed above with reference to FIGS. 1, 2A-2F, 3 and 4). The particles 502a have a nominal size, and the particles 504a have a nominal size. As shown, the BLT of the paste TIM 500a has a value BLT1. For example, in some embodiments of the method of FIG. 4, 402 may include selecting a quantity of particles of the first material, the particles having a nominal diameter between 100 nanometers and 150 microns. The first material may be provided at 402 by providing the quantity of particles of the first material.

Figure 5B:
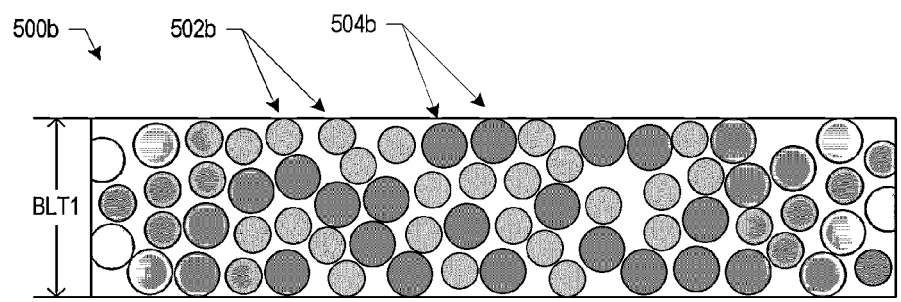

FIG. 5B depicts a paste TIM 500b including particles 502b of the first material of FIG. 5A and particles 504b of the metal material of FIG. 5A. While the nominal size of the particles 504b is the same as the nominal size of the particles 504a, the nominal size of the particles 504b is smaller than the nominal size of the particles 504a. As a result, the particles 502b and 504b of the paste TIM 500b are more closely packed than the particles 502a and 504a of the paste TIM 500a. This closer packing may result in improved thermal conductivity due to the higher density of particles of the first material (which, as discussed above, may have a thermal conductivity of 80 W/Kelvin-meter or higher). The BLT of the paste TIM 500b, as illustrated, has the same value BLT1 as the paste TIM 500a.

Figure 5C:
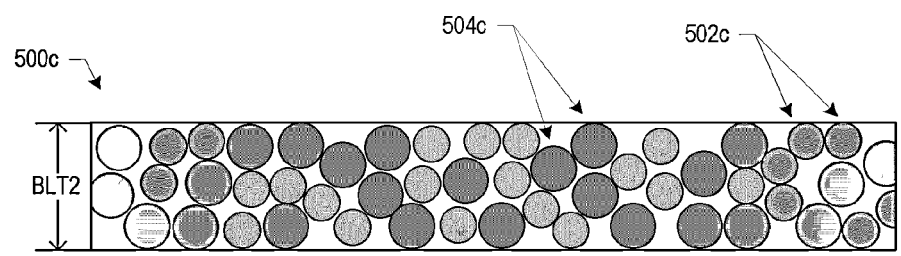

FIG. 5C depicts a paste TIM 500c including particles 502c of the first material of FIG. 5A and particles 504c of the metal material of FIG. 5A. However, the BLT of the paste TIM 500c has a value BLT2 that is smaller than BLT1, the value of the BLT of the paste TIM 500a of FIG. 5A. However, the number of particles 504c of the metal material of the paste TIM 500c may be approximately the same as the number of particles 504a of the metal material of the paste TIM 500a; the smaller nominal size of the particles 502c (as compared to the particles 502a) may allow closer packing of the particles in the paste TIM 500c than in the paste TIM 500a, and thus may allow a smaller BLT to be achieved. The size of the particles in a paste TIM may be selected with a desired BLT in mind. For example, in some embodiments of the method of FIG. 4, 402 may include identifying a desired BLT for the paste TIM, the BLT measurable after the paste TIM is cured, and selecting a nominal size for the particles of the first material based on the desired BLT. The first material may be provided at 402 by providing particles of the first material of the selected nominal size. In some embodiments, the desired BLT may be between approximately 20 microns and approximately 100 microns.

Figure 5D:
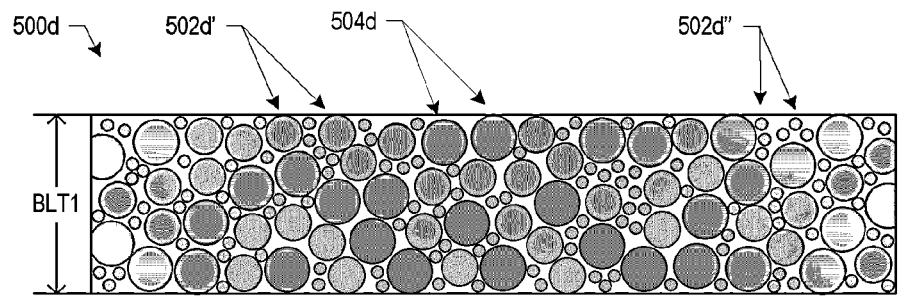

Additionally, in some embodiments, a distribution of particle sizes may be used for each of the first material and the metal material (as well as any other material included in a paste TIM). For example, FIG. 5D depicts a paste TIM 500d including particles 504d of the metal material of FIG. 5A and particles 502d' and 502d", having different nominal sizes, of the first material of FIG. 5A. A selected distribution of particle sizes may allow the paste TIM 500d to have a desired closeness of packing and thus a desired set of bulk properties. In some embodiments of the method of FIG. 4, therefore, 402 may include selecting a quantity of first particles of the first material, the first particles having a first nominal diameter; and selecting a quantity of second particles of the first material, the second particles having a second nominal diameter smaller than the first nominal diameter. The first material may be provided at 402 by providing the quantity of first particles and the quantity of second particles.

Various aspects of the paste TIMs and IC packages disclosed herein (such as IC package 100 and paste TIM 110, and others) may provide manufacturing and/or performance advantages over traditional TIMs and IC packages. For example, pre-formed STIMs (such as sheets of indium) typically require a flux to be applied to both sides, prior to use in an IC package, to clean off surface oxides in order to form a secure join. However, in order to achieve the desired thermal performance, this flux (typically 60% solvent by volume) must be driven out of the IC package during manufacturing by heating the IC package for long dwell periods (typically 30-60 minutes). This creates a substantial delay in the manufacturing process flow, and limits the number of IC packages that can be completed in a given period of time. By contrast, embodiments of the paste TIMs disclosed herein do not require the application of additional flux and may contain significantly less solvent by volume than standard flux, reducing the dwell time by an order of magnitude. The relatively small amount of solvent in the paste TIMs disclosed herein also reduces the risk of damaging voids formed by gas bubbles during heating, a weakness in existing TIMs.

Additionally, embodiments of the paste TIMs disclosed herein may achieve extremely small BLTs (as low as a few microns, typically in the tens of microns) without the risk of deformation and the need for precise alignment attendant with STIM pre-forms and without the poor thermal performance of PTIMs. As the development of IC technology continues to require thinner and smaller components, embodiments of the paste TIMs disclosed herein may achieve desired thermal performance, with the necessary form factors, and with improved manufacturing performance.

Additionally, the composition of the paste TIMs disclosed herein allows a manufacturer to balance cost and thermal performance to achieve a desired set of specifications. For example, Table 2 below presents a number of exemplary embodiments of the first and metal material compositions of paste TIMs, along with their thermal conductivity at room temperature (calculated based on the thermal conductivity of the components and a thermal conductivity mixing rule) and their cost per kilogram (based on current market estimates of the cost of the components). The numeric values presented in Table 2 are approximations, but reflect the wide range of performance and cost specifications achievable by various embodiments of the paste TIMs disclosed herein. These paste TIMs are also capable of achieving smaller BLTs than existing STIMs, such as indium pre-forms. Additionally, the exemplary embodiments presented in Table 2 each represent a range of paste TIM embodiments that may be achieved by varying the percentage compositions of the indicated materials (as well as additional materials, such as surface-active particles as described above).

TABLE 2

First and metal material compositions for example paste TIMs.

| Composition of first and metal materials (by volume) | Thermal Conductivity (approx, W/Kelvin-meter) | Price per Kilogram (US$) |
|---|---|---|
| 50% In, 50% SiC | 300 | 430 |
| 50% In, 50% Al2O3 | 60 | 350 |
| 50% In, 50% Diamond | 500-1000 | 15,000 |

Figure 6:
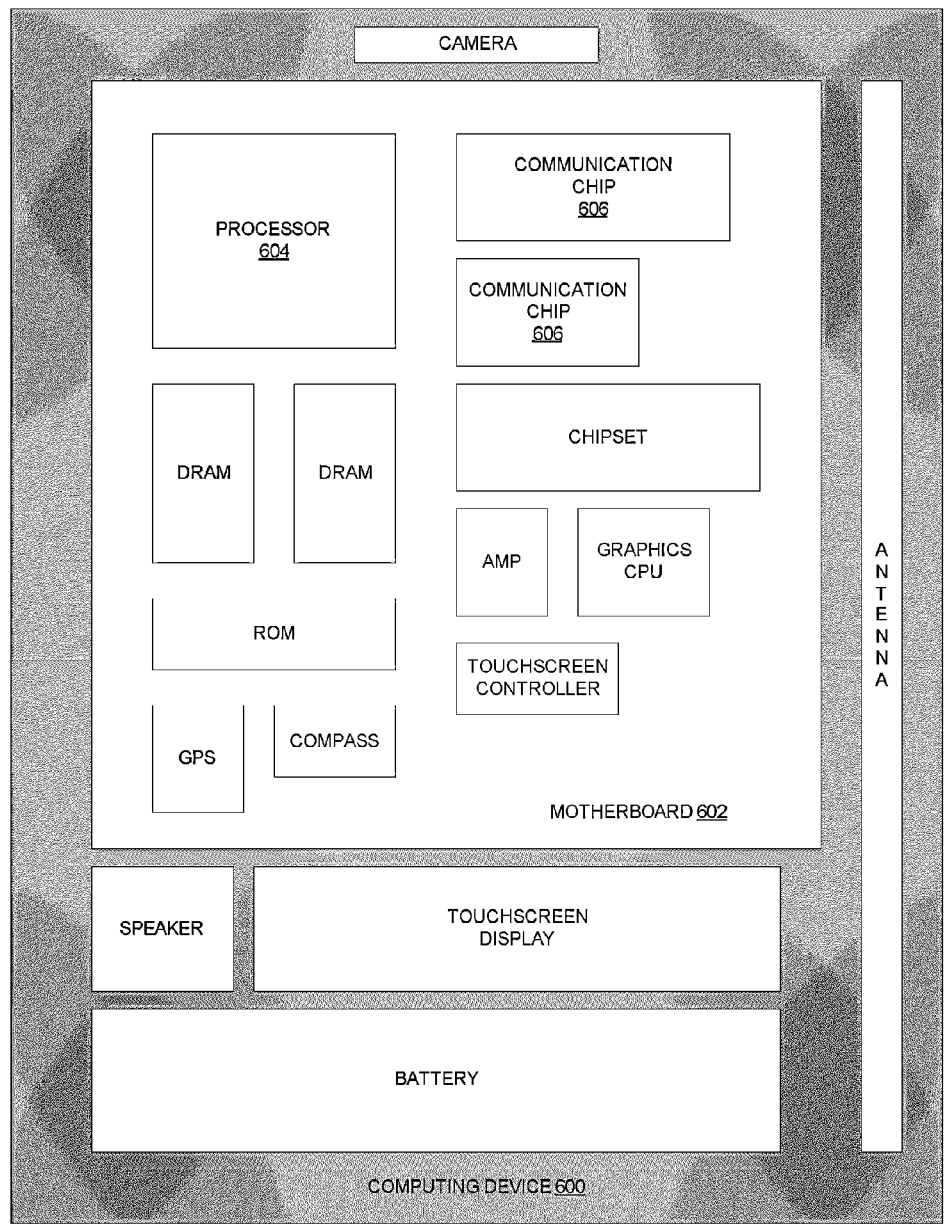
FIG. 6 schematically illustrates a computing device, in accordance with some embodiments.

Embodiments of the present disclosure may be implemented into a system using any suitable hardware and/or software to configure as desired. FIG. 6 schematically illustrates a computing device 600 in accordance with some implementations. The computing device 600 may house a board such as motherboard 602. The motherboard 602 may include a number of components, including but not limited to a processor 604 and at least one communication chip 606. The processor 604 may be physically and electrically coupled to the motherboard 602. In some implementations, the at least one communication chip 606 may also be physically and electrically coupled to the motherboard 602. In further implementations, the communication chip 606 may be part of the processor 604.

Depending on its applications, computing device 600 may include other components that may or may not be physically and electrically coupled to the motherboard 602. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 606 may enable wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 606 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 606 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 606 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 606 may operate in accordance with other wireless protocols in other embodiments.

The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 may include a die (e.g., included in IC component 108 of FIG. 1) in an IC package (e.g., IC package 100 of FIG. 1) as described herein. For example, the substrate 104 may be coupled with a circuit board such as the motherboard 602 using package-level interconnects such as, for example, solder balls or other suitable techniques. The term "processor" may refer to any device or portion of a device that processes electronic data from registers and/or memory to transform that electronic data into other electronic data that may be stored in registers and/or memory.

The communication chip 606 may also include a die (e.g., included in IC component 108 of FIG. 1) in an IC package (e.g., IC package 100 of FIG. 1) as described herein. In further implementations, another component (e.g., memory device or other integrated circuit device) housed within the computing device 600 may contain a die (e.g., included in IC component 108 of FIG. 1) in an IC package (e.g., IC package 100 of FIG. 1) as described herein. Such dies may be configured to send or receive signals through a bridge interconnect structure as described herein.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data. In some embodiments, the paste TIMs and IC packages described herein are implemented in a high-performance computing device. In some embodiments, the paste TIMs and IC packages described herein are implemented in handheld computing devices.

The above description of illustrated implementations, including what is described in the Abstract, is not intended to be exhaustive or to limit the disclosure to the precise forms disclosed. While specific implementations are described herein for illustrative purposes, various equivalent modifications are possible within the scope of the disclosure, as those skilled in the relevant art will recognize.

These modifications may be made to the disclosed embodiments in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

The following paragraphs provide a number of examples of embodiments of the present disclosure. In a first example, a method of fabricating an IC package is provided. The method may include dispensing a paste TIM on a first surface of an IC component, placing a heat spreader on the paste TIM, compressing the paste TIM between the heat spreader and the IC component, and curing the paste TIM. Variations on the first example may include any one or more of the following, in any combination: dispensing the paste TIM on the first surface of the IC component may include dispensing the paste TIM from a nozzle of a dispensing apparatus; the IC component may be disposed on a first surface of a substrate and placing a heat spreader on the paste TIM may include dispensing a sealant on the first surface of the substrate, the sealant spaced away from the IC component, and positioning the heat spreader such that a first portion of the heat spreader contacts the paste TIM and a second portion of the heat spreader contacts the sealant; compressing the paste TIM between the heat spreader and the IC component and curing the paste TIM may be performed as part of a thermocompression bonding operation; the bond line thickness of the paste TIM, after curing, may be between 20 microns and 100 microns; the paste TIM may include a solvent prior to curing, the solvent comprising less than 10% of the paste TIM, by weight, prior to curing; curing the paste TIM may include heating the paste TIM for less than 5 minutes; curing the paste TIM may include heating the paste TIM at a temperature between 100 degrees Celsius and 200 degrees Celsius; and the IC component may include a die.

In a second example, an IC package is provided. The IC package may include an IC component, a heat spreader, and a paste TIM disposed between the die and the heat spreader. The paste TIM may include particles of a metal material distributed through a matrix material and may have a bond line thickness, after curing, of between approximately 20 microns and approximately 100 microns. Variations on the second example may include any one or more of the following, in any combination: the matrix material may be a polymer matrix material; the particles of the metal material may include indium alloy particles or tin alloy particles; the paste TIM may have a thermal conductivity greater than 80 watts/Kelvin-meter; the paste TIM may be disposed against a first surface of the heat spreader and the IC package may further include a heat sink disposed on a second surface of the heat spreader, the second surface different from the first surface; and the particles of the metal material may have a nominal diameter between approximately 100 nanometers and approximately 150 microns.

In a third example, a paste TIM is provided. The paste TIM may include particles of a first material having a thermal conductivity greater than approximately 80 watts/Kelvin-meter, particles of a metal material, and a flux material. A melting temperature of the paste TIM may be between approximately 100 degrees Celsius and approximately 300 degrees Celsius. Variations on the third example may include any one or more of the following, in any combination: the metal material may include lead, a lead-tin alloy, indium, an indium-tin alloy, or a tin-silver-copper alloy; the first material may be a non-metal; the first material may include copper, diamond, graphite, silicon carbide, aluminum oxide, or graphene; the paste TIM may include particles of a surface-active material; a surface-active material in the paste TIM may include gold, silver, or germanium.

In a fourth example, a method of manufacturing a paste TIM is provided. The method may include providing a first material having a thermal conductivity greater than approximately 80 watts/Kelvin-meter, providing a metal material having a different chemical composition than the first material, and forming the paste TIM by combining particles of the first material, the metal material, and a flux material. The paste TIM may have a melting temperature between approximately 100 degrees Celsius and approximately 300 degrees Celsius. Variations on the fourth example may include any one or more of the following, in any combination: providing a first material may include selecting a quantity of first particles of the first material, the first particles having a first nominal diameter, selecting a quantity of second particles of the first material, the second particles having a second nominal diameter smaller than the first nominal diameter, and providing the first material by providing the quantity of first particles and the quantity of second particles; providing a first material may include identifying a desired bond line thickness for the paste TIM, the bond line thickness measurable after the paste TIM is cured, selecting a nominal size for the particles of the first material based on the desired bond line thickness, and providing the first material by providing particles of the first material of the selected nominal size; and a desired bond line thickness measurable after the paste TIM is cured may be between approximately 20 microns and approximately 100 microns.

What is claimed is:

1. A method of fabricating an integrated circuit (IC) package, the method comprising:
    dispensing a paste thermal interface material (TIM) on a first surface of an IC component;
    placing a heat spreader on the paste TIM;
    compressing the paste TIM between the heat spreader and the IC component; and
    curing the paste TIM;
    wherein:
        the paste TIM comprises particles of a metal material distributed through a matrix material and having a bond line thickness, after curing, of between approximately 20 microns and approximately 100 microns; or
        the paste TIM comprises particles of a first material having a thermal conductivity greater than approximately 80 watts/Kelvin-meter, particles of a metal material; and a flux material, and a melting temperature of the paste TIM is between approximately 100 degrees Celsius and approximately 300 degrees Celsius.

2. The method of claim 1, wherein dispensing the paste TIM on the first surface of the IC component comprises dispensing the paste TIM from a nozzle of a dispensing apparatus.

3. The method of claim 1, wherein the IC component is disposed on a first surface of a substrate and wherein placing a heat spreader on the paste TIM comprises:
    dispensing a sealant on the first surface of the substrate, the sealant spaced away from the IC component; and
    positioning the heat spreader such that a first portion of the heat spreader contacts the paste TIM and a second portion of the heat spreader contacts the sealant.

4. The method of claim 1, wherein compressing the paste TIM between the heat spreader and the IC component and curing the paste TIM are performed as part of a thermocompression bonding operation.

5. The method of claim 1, wherein the bond line thickness of the paste TIM, after curing, is between 20 microns and 100 microns.

6. The method of claim 1, wherein the paste TIM comprises a solvent prior to curing, the solvent comprising less than 10% of the paste TIM, by weight, prior to curing.

7. The method of claim 1, wherein curing the paste TIM comprises heating the paste TIM for less than 5 minutes.

8. The method of claim 1, wherein curing the paste TIM comprises heating the paste TIM at a temperature between 100 degrees Celsius and 200 degrees Celsius.

9. The method of claim 1, wherein the IC component comprises a die.

10. An integrated circuit (IC) package, comprising:
    an IC component;
    a heat spreader; and
    a paste thermal interface material (TIM) disposed between the IC component and the heat spreader, the paste TIM comprising particles of a metal material distributed through a matrix material and having a bond line thickness, after curing, of between approximately 20 microns and approximately 100 microns.

11. The IC package of claim 10, wherein the matrix material is a polymer matrix material.

12. The IC package of claim 10, wherein the particles of the metal material comprise indium alloy particles or tin alloy particles.

13. The IC package of claim 10, wherein the paste TIM has a thermal conductivity greater than 80 watts/Kelvin-meter.

14. The IC package of claim 10, wherein the paste TIM is disposed against a first surface of the heat spreader, the IC package further comprising:
    a heat sink disposed on a second surface of the heat spreader, the second surface different from the first surface.

15. The IC package of claim 10, wherein the particles of the metal material have a nominal diameter between approximately 100 nanometers and approximately 150 microns.

16. The IC package of claim 10, wherein the IC component comprises a die.

17. A paste thermal interface material (TIM) comprising:
    particles of a first material having a thermal conductivity greater than approximately 80 watts/Kelvin-meter;
    particles of a metal material; and
    a flux material;
    wherein a melting temperature of the paste TIM is between approximately 100 degrees Celsius and approximately 300 degrees Celsius.

18. The paste TIM of claim 17, wherein the metal material comprises lead, a lead-tin alloy, indium, an indium-tin alloy, or a tin-silver-copper alloy.

19. The paste TIM of claim 17, wherein the first material is a non-metal.

20. The paste TIM of claim 17, wherein the first material comprises copper, diamond, graphite, silicon carbide, aluminum oxide, or graphene.

21. The paste TIM of claim 17, further comprising:
   particles of a surface-active material.

22. The paste TIM of claim 21, wherein the surface-active material comprises gold, silver, or germanium.

23. The paste TIM of claim 17, wherein the paste TIM is cured and has a bond line thickness of between 20 microns and 100 microns.

24. A method of manufacturing a paste thermal interface material (TIM), the method comprising:
   providing particles of a first material having a thermal conductivity greater than approximately 80 watts/Kelvin-meter;
   providing particles of a metal material having a different chemical composition than the first material; and
   forming the paste TIM by combining the particles of the first material, the particles of the metal material, and a flux material, the paste TIM having a melting temperature between approximately 100 degrees Celsius and approximately 300 degrees Celsius.

25. The method of claim 24, wherein providing a first material comprises:
   selecting a quantity of first particles of the first material, the first particles having a first nominal diameter;
   selecting a quantity of second particles of the first material, the second particles having a second nominal diameter smaller than the first nominal diameter; and
   providing the particles of the first material by providing the quantity of first particles and the quantity of second particles.

26. The method of claim 24, wherein providing particles of the first material comprises:
   identifying a desired bond line thickness for the paste TIM, the bond line thickness measurable after the paste TIM is cured;
   selecting a nominal size for the particles of the first material based on the desired bond line thickness; and
   providing the particles of the first material by providing particles of the first material of the selected nominal size.

27. The method of claim 26, wherein the desired bond line thickness is between approximately 20 microns and approximately 100 microns.

* * * * *